United States Patent
Park et al.

(10) Patent No.: US 9,245,966 B2
(45) Date of Patent: Jan. 26, 2016

(54) WIRING, THIN FILM TRANSISTOR, THIN FILM TRANSISTOR PANEL AND METHODS FOR MANUFACTURING THE SAME

(75) Inventors: Jae-Woo Park, Seongnam-si (KR); Sung-Haeng Cho, Chungcheongbuk-do (KR); Kyong-Sub Kim, Suwon-si (KR); Dong-Yeon Cho, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 740 days.

(21) Appl. No.: 13/242,257

(22) Filed: Sep. 23, 2011

(65) Prior Publication Data

US 2012/0217500 A1 Aug. 30, 2012

(30) Foreign Application Priority Data

Feb. 24, 2011 (KR) .................. 10-2011-0016549

(51) Int. Cl.
*H01L 29/49* (2006.01)
*H01L 29/45* (2006.01)
*H01L 29/786* (2006.01)

(52) U.S. Cl.
CPC .............. *H01L 29/45* (2013.01); *H01L 29/458* (2013.01); *H01L 29/7869* (2013.01); *H01L 29/78669* (2013.01); *H01L 29/78678* (2013.01)

(58) Field of Classification Search
CPC . H01L 29/45; H01L 29/458; H01L 29/78669; H01L 29/78678; H01L 29/7869
USPC .............. 257/59, 72, 751, E33.053, E21.412, 257/E23.01
See application file for complete search history.

(56) References Cited

U.S. PATENT DOCUMENTS

| | | | |
|---|---|---|---|
| 7,652,854 B2 * | 1/2010 | Kagami et al. ................ 360/319 |
| 2004/0002188 A1 * | 1/2004 | Chung .......................... 438/240 |
| 2004/0178431 A1 * | 9/2004 | Moon et al. ................... 257/295 |
| 2007/0212809 A1 * | 9/2007 | Ohto et al. ....................... 438/99 |
| 2009/0087982 A1 * | 4/2009 | Wang et al. ................... 438/653 |
| 2009/0134443 A1 * | 5/2009 | Mouli et al. .................. 257/315 |
| 2009/0224257 A1 | 9/2009 | Chin et al. |
| 2010/0193365 A1 * | 8/2010 | Lopatin et al. ................ 205/111 |

(Continued)

FOREIGN PATENT DOCUMENTS

| CN | 100383898 C | 4/2008 |
| CN | 101527307 A | 9/2009 |

OTHER PUBLICATIONS

Chinese Office Action for Chinese Patent Application No. 201210046417.2 dated Oct. 20, 2015.

*Primary Examiner* — Michael Shingleton
(74) *Attorney, Agent, or Firm* — Cantor Colburn LLP

(57) ABSTRACT

A thin film transistor includes a gate electrode, a gate insulating layer on the gate electrode, a semiconductor on the gate insulating layer, and a drain electrode and a source electrode on the semiconductor and spaced apart from each other. Each of the drain electrode and the source electrode includes a first metal diffusion preventing layer which prevents diffusion of metal atoms, and a second metal diffusion preventing layer on the first metal diffusion preventing layer. At least one of the first and second metal diffusion preventing layers includes grains in a columnar structure, which are in a direction substantially perpendicular to a lower layer. First grain boundaries of the first metal diffusion preventing layer and second grain boundaries of the second metal diffusion preventing layer are substantially discontinuous in a direction perpendicular to the semiconductor.

11 Claims, 13 Drawing Sheets

(56) References Cited

U.S. PATENT DOCUMENTS

| | | | |
|---|---|---|---|
| 2010/0224995 A1* | 9/2010 | Ohto et al. | 257/751 |
| 2011/0088762 A1* | 4/2011 | Singh et al. | 136/255 |
| 2011/0095427 A1* | 4/2011 | Goswami et al. | 257/751 |
| 2011/0242468 A1* | 10/2011 | Choi et al. | 349/129 |
| 2012/0217500 A1* | 8/2012 | Park et al. | 257/59 |
| 2012/0267631 A1* | 10/2012 | Moon et al. | 257/59 |
| 2014/0001469 A1* | 1/2014 | Park et al. | 257/43 |
| 2014/0167039 A1* | 6/2014 | Yamazaki | 257/43 |

\* cited by examiner

WIRING, THIN FILM TRANSISTOR, THIN FILM TRANSISTOR PANEL AND METHODS FOR MANUFACTURING THE SAME

This application claims priority to Korean Patent Application Serial No. 10-2011-0016549 filed on Feb. 24, 2011, and all the benefits accruing therefrom under 35 U.S.C. §119(a), the disclosure of which is incorporated by reference herein with its entirety.

BACKGROUND OF THE INVENTION

1. Field of the Invention

The invention relates to a wiring, a thin film transistor, a thin film transistor panel, and methods for manufacturing the same.

2. Description of the Related Art

In general, wirings or electrodes including chrome (Cr), aluminum (Al), molybdenum (Mo), or an alloy thereof are mainly used in semiconductor devices or liquid crystal display devices. For microfabrication of the semiconductor devices, due to high integration and a fast operating speed, copper (Cu) which has a lower electric resistance and has a higher resistance to electromigration and stress migration compared to aluminum, has been used for wirings or electrodes in semiconductor devices.

Even in the field of display devices represented by liquid crystal display devices and the like, low-resistance wirings are required due to the increase in resolution and display area, and the integration of devices including sensors and driver circuits, which may be integrated in the display devices. Therefore, gate or data wirings made of copper, or gate, drain and source electrodes of a thin film transistor ("TFT"), which are also made of copper, are applied to display devices.

However, when copper is used for wirings or electrodes, the diffusion of copper into adjacent circuit elements or a semiconductor layer of a TFT may degrade characteristics of pixel elements or TFTs. Therefore, it is required to prevent metal atoms, for example, copper atoms, contained in wirings or electrodes from being spread around and diffused into adjacent elements or layers.

BRIEF SUMMARY OF THE INVENTION

Exemplary embodiments of the invention address at least the above-mentioned problems and/or disadvantages and provide at least the advantages described below. Accordingly, an exemplary embodiment of the invention provides a thin film transistor ("TFT") which prevents diffusion of copper, and methods for manufacturing the same.

Another exemplary embodiment of the invention provides a TFT panel having excellent reliability by applying copper wirings thereto for large and high-resolution display devices, and methods for manufacturing the same.

In accordance with one exemplary embodiment of the invention, there is provided a TFT including a gate electrode, a gate insulating layer on the gate electrode, a semiconductor on the gate insulating layer, and a drain electrode and a source electrode on the semiconductor and spaced apart from each other. Each of the drain electrode and the source electrode include a first metal diffusion preventing layer which prevents diffusion of metal atoms, and a second metal diffusion preventing layer on the first metal diffusion preventing layer. At least one of the first and second metal diffusion preventing layers includes grains in a columnar structure, which are in a direction substantially perpendicular to a lower layer, and first grain boundaries of the first metal diffusion preventing layer and second grain boundaries of the second metal diffusion preventing layer are substantially discontinuous in a direction perpendicular to the semiconductor.

In accordance with another exemplary embodiment of the invention, there is provided a TFT panel including a gate electrode connected to a gate wiring on an insulating substrate, a gate insulating layer on the gate electrode, a semiconductor on the gate insulating layer, a drain electrode and a source electrode on the semiconductor and spaced apart from each other, and a pixel electrode connected to the drain electrode and the source electrode. Each of the drain electrode and the source electrode includes a first metal diffusion preventing layer, a second metal diffusion preventing layer, and a source-drain layer on the second metal diffusion preventing layer. At least one of the first and second metal diffusion preventing layers includes grains in a columnar structure, which are in a direction substantially perpendicular to a lower layer, and first grain boundaries of the first metal diffusion preventing layer and second grain boundaries of the second metal diffusion preventing layer are substantially discontinuous in a direction perpendicular to the semiconductor.

In accordance with a further exemplary embodiment of the invention, there is provided a wiring including a first wiring metal diffusion preventing layer on a substrate, a second wiring metal diffusion preventing layer on the first wiring metal diffusion preventing layer, and a metal wiring on the second wiring metal diffusion preventing layer. At least one of the first and second wiring metal diffusion preventing layers is includes grains in a columnar structure, which are in a direction substantially perpendicular to a lower layer, and first grain boundaries of the first wiring metal diffusion preventing layer and second grain boundaries of the second wiring metal diffusion preventing layer are substantially discontinuous in a direction parallel to a direction of the grains.

In accordance with yet another exemplary embodiment of the invention, there is provided a method for manufacturing a TFT panel. The method includes forming a gate electrode connected to a gate wiring on an insulating substrate, forming a gate insulating layer on the gate electrode, forming a semiconductor on the gate insulating layer, forming a drain electrode and a source electrode on the semiconductor and spaced apart from each other, and forming a pixel electrode connected to the drain electrode or the source electrode. The drain and source electrodes including a first metal diffusion preventing layer, a second metal diffusion preventing layer, and a source-drain layer on the second metal diffusion preventing layer are formed on the semiconductor. At least one of the first and second metal diffusion preventing layers is formed to include grains in a columnar structure, which have grown up in a direction substantially perpendicular to a lower layer, and first grain boundaries of the first metal diffusion preventing layer and second grain boundaries of the second metal diffusion preventing layer are formed substantially discontinuously in a direction perpendicular to the semiconductor.

BRIEF DESCRIPTION OF THE DRAWINGS

The above and other features of the invention will become more apparent by describing in detail exemplary embodiments thereof with reference to the accompanying drawings, in which.

DETAILED DESCRIPTION OF THE INVENTION

Figure 1:
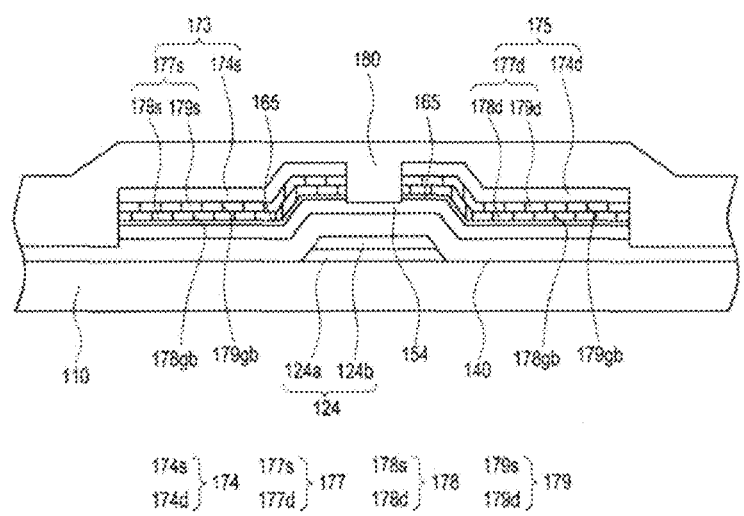
FIG. 1 is a cross-sectional view of an exemplary embodiment of a thin film transistor ("TFT") according to the invention.

Exemplary embodiments of the invention will now be described in detail with reference to the accompanying drawings. In the following description, specific details such as detailed configuration and components are merely provided to assist the overall understanding of exemplary embodiments of the invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

Throughout the drawings, the same drawing reference numerals will be understood to refer to the same elements, features and structures.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Figure 2A:
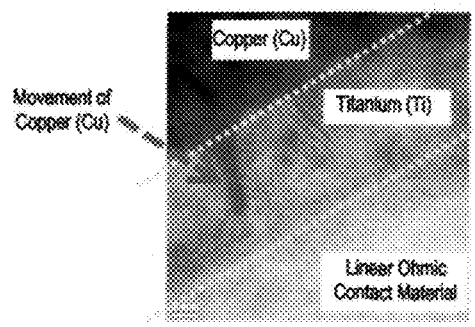
FIG. 2A is a transmission electron microscope ("TEM") image of a side cross-sectional view of a source electrode of a conventional TFT.
Figure 2B:
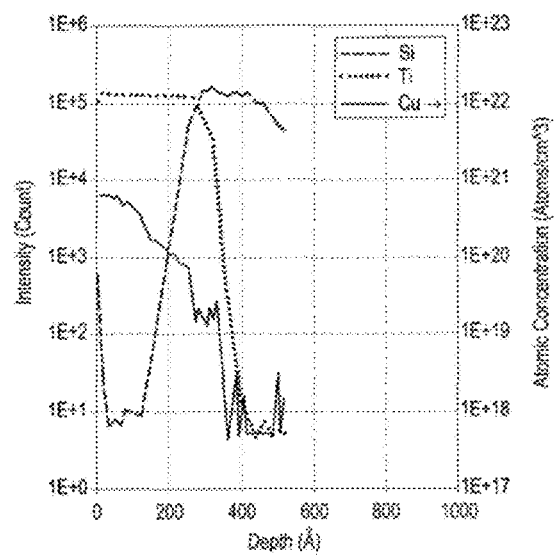
FIG. 2B is a graph illustrating a composition analysis made along a thickness direction of one side of the source electrode shown in FIG. 2A by the Time of Flight Secondary Ion Mass Spectrometry TOF-SIMS equipment.

Exemplary embodiments of a thin film transistor ("TFT") and a manufacturing method thereof according to the invention will be described in detail with reference to FIGS. 1 to 13. FIG. 1 is a cross-sectional view of an exemplary embodiment of a TFT according to the invention. FIG. 2A is a transmission electron microscope ("TEM") image of a side cross-sectional view of a source electrode of a conventional TFT. FIG. 2B is a graph illustrating a composition analysis made along a thickness direction of one side of the source electrode shown in FIG. 2A by the Time of Flight Secondary Ion Mass Spectrometry ("TOF-SIMS") equipment. FIGS. 3 to 13 are cross-sectional views illustrating an exemplary embodiment of a method for manufacturing the TFT shown in FIG. 1 according to the invention.

A structure of a TFT will now be described in detail with reference to FIG. 1. The TFT illustrated in FIG. 1 is constructed such that a semiconductor layer is between a gate electrode, and a metal diffusion preventing layer (or a metal diffusion barrier) included in a source electrode or a drain electrode, according to the invention.

A gate electrode 124 is on a transparent substrate 110 including single crystal, polycrystal, glass, or plastic materials. In one exemplary embodiment of the invention, the gate electrode 124 has a double-layer structure including a first gate sub-electrode 124a including titanium (Ti) or a titanium alloy, and a second gate sub-electrode 124b including copper (Cu) or a copper alloy. The gate electrode 124 controls a current flowing through a channel formed between a source electrode 173 and a drain electrode 175 based on a voltage being applied to the gate electrode 124. The gate electrode 124 may include a material selected from the group consisting of Cr, Mo, Ti, Ta, Al, Cu, Ag and a mixture thereof. In the alternative, the gate electrode 124 may have the following double-layer or triple-layer structure. In exemplary embodiments, for example, the double-layer structure may include Al/Mo, Al/Ti, Al/Ta, Al/Ni, Al/TiNx, Al/Co, Cu/CuMn, Cu/Ti, Cu/TiN, or Cu/TiOx, while the triple-layer structure may include Mo/Al/Mo, Ti/Al/Ti, Co/Al/Co, Ti/Al/Ti, TiNx/Al/Ti, CuMn/Cu/CuMn, Ti/Cu/Ti, TiNx/Cu/TiNx, or TiOx/Cu/TiOx.

A gate insulating layer 140 is directly on the gate electrode 124. The gate insulating layer 140 may include an inorganic insulating material, an organic insulating material, or an organic/inorganic insulating material. The inorganic insulating material can be silicon nitride (SiNx), silicon oxide (SiOx), titanium oxide ($TiO_2$), alumina ($Al_2O_3$), or zirconia ($ZrO_2$). The organic insulating material can be poly siloxane, phenyl siloxane, polyimide, silsesquioxane, silane, or any organic insulating material which can be easily used by those skilled in the art. The organic/inorganic insulating material can be a mixture of at least one material selected from the above-described inorganic insulating materials and at least one material selected from the above-described organic insulating materials, for example, a mixture of silicon oxide (SiOx) and poly siloxane.

Particularly, an organic insulating material including poly siloxane and an organic/inorganic insulating material including poly siloxane have characteristics such as high thermal resistance, high optical transparency, and good adhesion to other layers at about 350° C. or more. The gate insulating layer 140 including an inorganic insulating material may be about 2,000 angstroms (Å) to about 4,000 Å thick, more preferably about 3,000 Å thick. The gate insulating layer 140 including an organic insulating material or an organic/inorganic insulating material may be about 3,000 Å to about 50,000 Å thick, more preferably about 20,000 Å thick. The thickness dimension is taken perpendicular to the transparent substrate 110. To insulate the gate electrode 124 from a semiconductor layer 154, the gate insulating layer 140 may have two or more layers, for example, two layers including a silicon nitride (SiNx) layer contacting the gate electrode 124 and a silicon oxide (SiOx) layer contacting the semiconductor layer 154.

The semiconductor layer 154 is directly on the gate insulating layer 140. The semiconductor layer 154 may include amorphous silicon, crystalline silicon, or oxide semiconductor. The semiconductor layer 154 may overlap the gate electrode 124, the source electrode 173, and the drain electrode 175, and forms a channel of the TFT. The TFT's channel, through which charges move during an operation of the TFT, is formed with the semiconductor layer 154 between the source electrode 173 and the drain electrode 175. The semiconductor layer 154 may be about 1,000 Å to about 2,500 Å thick, more preferably about 1,700 Å thick. The oxide semiconductor can be a compound having the formula expressed as $A_XB_XO_X$ or $A_XB_XC_XO_X$, where A may be Zn or Cd, B may be Ga, Sn or In, and C may be Zn, Cd, Ga, In, or Hf. In addition, $X \neq 0$, and A, B, and C are different from one another. In accordance with another embodiment of the invention, the oxide semiconductor may be a material selected from the group consisting of InZnO, InGaO, InSnO, ZnSnO, GaSnO, GaZnO, GaZnSnO, GaInZnO, HfInZnO, HfZnSnO and ZnO. An effective mobility of this oxide semiconductor is about 2 to 100 times higher than that of hydrogenated amorphous silicon.

A linear ohmic contact material 165 may be directly on the semiconductor layer 154. The linear ohmic contact material 165 is interposed between the semiconductor layer 154 and the source electrode 173 or between the semiconductor layer 154 and the drain electrode 175, to lower the contact resistance therebetween. The linear ohmic contact material 165 does not overlap the channel. The linear ohmic contact material 165 may be about 200 Å to about 500 Å thick. The linear ohmic contact material 165 may be an amorphous silicon layer containing n-type impurities or an oxide of GaZnO. When the semiconductor layer 154 includes an oxide semiconductor material, the linear ohmic contact material 165 may be omitted, and the source electrode 173 and the drain electrode 175 may be directly on the semiconductor layer 154.

The source electrode 173 and the drain electrode 175 are directly on the linear ohmic contact material 165 or the semiconductor layer 154 and spaced apart from each other. Each of the source electrode 173 and the drain electrode 175 includes a main electrode layer 174 and a metal diffusion preventing layer 177. That is, the source electrode 173 includes a first source electrode layer 174s and a source metal diffusion preventing layer 177s, and the drain electrode 175 includes a first drain electrode layer 174d and a drain metal diffusion preventing layer 177d. The main electrode layer 174 includes the first source electrode layer 174s and the first drain electrode layer 174d, and the metal diffusion preventing layer 177 includes the source metal diffusion preventing layer 177s and the drain metal diffusion preventing layer 177d.

The source metal diffusion preventing layer 177s includes a first source metal diffusion preventing sub-layer 178s and a second source metal diffusion preventing sub-layer 179s, and the drain metal diffusion preventing layer 177d includes a first drain metal diffusion preventing sub-layer 178d and a second drain metal diffusion preventing sub-layer 179d. The first source metal diffusion preventing sub-layer 178s and the first drain metal diffusion preventing sub-layer 178d include the same material, and are included in a first metal diffusion preventing sub-layer 178. The second source metal diffusion preventing sub-layer 179s and the second drain metal diffusion preventing sub-layer 179d include the same material, and are included in a second metal diffusion preventing sub-layer 179. Each of the first metal diffusion preventing sub-layer 178 and the second metal diffusion preventing sub-layer 179 may be about 30 Å to about 1000 Å thick, more preferably about 50 Å to about 500 Å thick.

In accordance with an embodiment of the invention, the first source electrode layer 174s and the first drain electrode layer 174d may include the same material as that of the gate electrode 124, more preferably of copper (Cu). In accordance with an embodiment of the invention, as to the metal diffusion preventing layer 177, grain boundaries have a discontinuous N-layer structure (where $N \geq 2$). The source and drain metal diffusion preventing layers 177s and 177d are between the semiconductor layer 154 and the first source electrode layer 174s, and between the semiconductor layer 154 and the first drain electrode layer 174d, respectively. The metal diffusion preventing layer 177 including the source and drain metal diffusion preventing layers 177s and 177d reduces or effectively prevents metal atoms of the first source electrode layer 174s and/or the first drain electrode layer 174d from diffusing into the semiconductor layer 154. If the metal atoms are diffused into the semiconductor layer 154, an off-current Ioff of the TFT may increase, leading to degradation of the TFT characteristics.

Inventors of this application have discovered the mechanism in which a TFT suffers from the degradation is described below with reference to FIGS. 2A and 2B. FIG. 2A is a TEM image of a side cross-sectional of a source electrode of the conventional TFT used for this experiment. More specifically, FIG. 2A is a TEM image of a side cross-sectional of a source electrode including copper (Cu), a linear ohmic contact material (or an amorphous silicon layer containing n-type impurities), and a metal layer including titanium (Ti) interposed therebetween. Referring to FIG. 2A, in a certain portion of the titanium (Ti) layer where copper (Cu) atoms diffuse into the titanium (Ti) layer, the crystalline structure of the titanium (Ti) layer is different from that of adjacent titanium (Ti) layers.

FIG. 2B is a graph illustrating a composition analysis made by the TOF-SIMS equipment along a thickness direction of a side cross-sectional of the metal layers shown in FIG. 2A. The horizontal axis (or x-axis) represents a depth (A) of the metal layers, i.e., a distance from the copper (Cu) layer to the linear ohmic contact material. The vertical axis (or y-axis) represents intensity at which secondary ions are jutting, and atomic concentration. In the graph shown in FIG. 2B, titanium (Ti) atoms and silicon (Si) atoms have different intensity values with respect to the depth corresponding to the horizontal axis, and copper (Cu) atoms have different atomic concentration values with respect to the depth corresponding to the horizontal axis. A portion where a value of the horizontal axis, i.e., the depth (Å), is 0 represents a boundary between the copper (Cu) layer and the titanium (Ti) layer. A portion where a value of the horizontal axis is about 300 Å is a boundary between the titanium (Ti) layer and the linear ohmic contact material. Referring to FIG. 2B, it can be noted that (Cu) atoms of the copper (Cu) layer diffuse into the titanium (Ti) layer. In conclusion, it is noted from FIGS. 2A and 2B that (Cu) atoms of the source electrode move or diffuse along the grain boundaries of the titanium (Ti) layer. Therefore, in order to improve the reliability of the TFT, it is required to prevent metal atoms of the main electrode layer 174 from moving along the grain boundaries of a layer around the main electrode layer 174.

In accordance with an embodiment of the invention, first grain boundaries 178gb of the first metal diffusion preventing sub-layer 178 and second grain boundaries 179gb of the second metal diffusion preventing sub-layer 179 are substantially discontinuous or substantially cross each other. In accordance with an embodiment of the invention, the first metal diffusion preventing sub-layer 178 and the second metal diffusion preventing sub-layer 179 may have a polycrystalline structure including grain boundaries in a columnar structure, including titanium (Ti) atoms. In this way, the first grain boundaries 178gb of the first metal diffusion preventing sub-layer 178 which are formed by grains having a substantially columnar structure, and the second grain boundaries 179gb of the second metal diffusion preventing sub-layer 179 which are formed by grains having a substantially columnar structure, substantially discontinuously cross each other in a direction perpendicular to a lower layer of the TFT, thereby blocking movements of metal atoms of the main electrode layer 174, for example, copper atoms or particles. As illustrated in FIG. 1, the first and second grain boundaries 178gb and 179gb alternate with each other in a direction parallel to the transparent substrate 110.

In accordance with another embodiment of the invention, of the first metal diffusion preventing sub-layer 178 and the second metal diffusion preventing sub-layer 179 of the source electrode 173 and the drain electrode 175, any one metal diffusion preventing sub-layer may have an amorphous structure while the other metal diffusion preventing sub-layer may have a polycrystalline structure including grain boundaries. The metal diffusion preventing sub-layer having an amorphous structure may include titanium nitride (TiNx) or titanium oxide (TiOx), while the metal diffusion preventing sub-layer having a polycrystalline structure may include titanium (Ti) in a columnar structure. This metal diffusion preventing sub-layer, which has an amorphous structure in the source electrode 173 and the drain electrode 175, prevents metal atoms of the main electrode layer 174, for example, copper atoms or particles, from diffusing or moving into the semiconductor layer 154. An exemplary embodiment of a method of forming the source electrode 173 and the drain electrode 175 will be described in detail when a description of a TFT manufacturing method is made.

A protection layer 180 may be directly on the source electrode 173 and the drain electrode 175. The protection layer 180 may include the above-described inorganic insulating material, organic insulating material, or organic/inorganic insulating material, included in the gate insulating layer 140. The protection layer 180 including an inorganic insulating material may be about 300 Å to about 2,000 Å thick, more preferably about 500 Å thick. The protection layer 180 including an organic insulating material or an organic/inorganic insulating material may be about 25,000 Å to about 35,000 Å thick. In accordance with an embodiment of the invention, the protection layer 180 protecting the channel of the TFT may include a lower protection layer directly contacting the semiconductor layer 154 and including an inorganic insulating material, and an upper protection layer directly on the lower protection layer and including an organic insulating material.

The exemplary embodiments of the metal diffusion preventing layer 177 included in the source electrode 173 and the drain electrode 175 reduces or effectively prevents the metal atoms or particles included in the source electrode 173 and the drain electrode 175 from moving into the semiconductor layer 154, thereby improving the reliability of the TFT.

Exemplary embodiments of methods for manufacturing the TFT illustrated in FIG. 1 will now be described in detail with reference to FIGS. 3 to 13. Descriptions of materials or structures of the TFT illustrated with reference to FIG. 1 will be omitted to avoid redundant description. Although methods of manufacturing a TFT using all the possible materials and structures mentioned with reference to FIG. 1 will not be described hereinbelow, it is apparent that those skilled in the art may easily manufacture a TFT using the above-described materials and structures. FIGS. 3 to 13 are cross-sectional views illustrating an exemplary embodiment of a method for manufacturing the TFT shown in FIG. 1 according to the invention.

Figure 3:
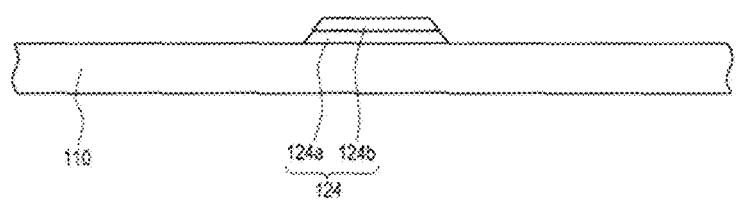
FIGS. 3 to 13 are cross-sectional views illustrating an exemplary embodiment of a method for manufacturing the TFT shown in FIG. 1 according to the invention.

Referring to FIG. 3, a metallic material forming a gate electrode 124 is stacked on the substrate 110, and patterned to form the gate electrode 124. An exemplary embodiment of method of forming the gate electrode 124 having a double-layer structure that includes a first gate sub-electrode 124a having titanium (Ti) or a titanium (Ti) alloy, and a second gate sub-electrode 124b having copper (Cu) or a copper (Cu) alloy according to the invention will now be described in detail below.

A first gate electrode layer of titanium (Ti) or a titanium (Ti) alloy, forming the first gate sub-electrode 124a, is stacked directly on the substrate 110, and a second gate electrode layer of copper (Cu) or a copper (Cu) alloy, forming the second gate sub-electrode 124b, is stacked directly on the first gate electrode layer. The first gate electrode layer may be about 10 Å to about 1,000 Å thick, and the second gate electrode layer may be about 1,000 Å to about 7,000 Å thick. A photo resist (not shown) is formed on this double-layer structure. The photo resist undergoes exposure and development by a mask with a light passing area having a gate electrode pattern, and a light blocking area. By using the patterned photo resist as a mask, materials of the first and second gate electrode layers, which are not covered by the photo resist, are etched by an etching process such as dry etching and wet etching, to finally form the gate electrode 124.

In a wet etching process, materials of the first and second gate electrode layers may be etched together by one etchant, or may be etched in sequence by independent etchants. In accordance with an embodiment of the invention, an etchant for etching a copper (Cu) layer forming the second gate electrode layer may include persulfate, azole-containing compounds, oxidation regulator, and composition stabilizer. The persulfate is the major composition of the oxidizer for etching the copper (Cu) layer. The persulfate may include at least one material selected from the group consisting of ammonium persulfate, potassium persulfate, sodium persulfate, oxone, and a mixture thereof. The azole-containing compounds suppress etching of the copper (Cu) layer. The azole-containing compounds may include at least one material selected from the group consisting of benzotriazole, aminoterazole, imidazole, pyrazole, and a mixture thereof. The oxidation regulator (or an oxidation regulating agent) regulates oxidation and etching of the copper (Cu) layer. The oxidation regulator may include nitric acid ($HNO_3$) which is inorganic acid, and acetic acid (AA) which is organic acid. The composition stabilizer reduces decomposition rate of the persulfate. The composition stabilizer may include at least one material selected from the group consisting of methane sulfonic acid, nitric acid, phosphoric acid, sulfuric acid, hydrochloric acid, and a mixture thereof. In one exemplary embodiment of the invention, the etchant for etching the copper (Cu) layer includes ammonium persulfate of about 12 wt %, aminoterazole of about 1 wt %, nitric acid ($HNO_3$) of about 3 wt %, acetic acid (AA) of about 3.2 wt %, methane sulfonic acid of about 0.1 wt %, except for a solvent. The solvent may be deionized water.

In accordance with an embodiment of the invention, the etchant for etching the copper (Cu) layer forming the second gate electrode layer and the titanium (Ti) layer forming the first gate electrode layer together, may include persulfate, azole-containing compounds, oxidation regulator, composition stabilizer, and oxidation auxiliary. The persulfate, azole-containing compounds, oxidation regulator, and composition stabilizer are the same as those of the etchant for copper (Cu) layer alone. The oxidation auxiliary quickly etches the copper (Cu) layer, and etches the titanium (Ti) layer or the titanium (Ti) alloy layer. The oxidation auxiliary may include fluoride-containing compounds including fluorine (F), for example, at least one material selected from the group consisting of hydrofluoric acid (HF), ammonium fluoride ($NH_4F$), ammonium bifluoride ($NH_4HF_2$), potassium fluoride (KF), sodium fluoride (NaF), calcium hydrogen fluoride (CaHF), sodium hydrogen fluoride ($NaHF_2$), ammonium fluoride ($NH_4F$), ammonium hydrogen fluoride ($NH_4HF2$), ammonium fluoborate ($NH_4BF_4$), potassium fluoride (KF), potassium hydrogen fluoride ($KHF_2$), aluminum fluoride ($AlF_3$), fluoboric acid-borofluoric acid ($HBF_4$), lithium fluoride (LiF), potassium fluoroborate ($KBF_4$), calcium fluoride ($CaF_2$), fluorosilicate (FS), and a mixture thereof, as inorganic acid. In one exemplary embodiment of the invention, the etchant for etching the copper (Cu) layer and the titanium (Ti) layer together includes ammonium persulfate of about 12 wt %, aminoterazole of about 1 wt %, nitric acid ($HNO_3$) of about 3 wt %, acetic acid (AA) of about 3.2 wt %, methane sulfonic acid of about 0.1 wt %, hydrofluoric acid (HF) of about 0.5 wt %, except for a solvent. The solvent may be deionized water.

Figure 4:
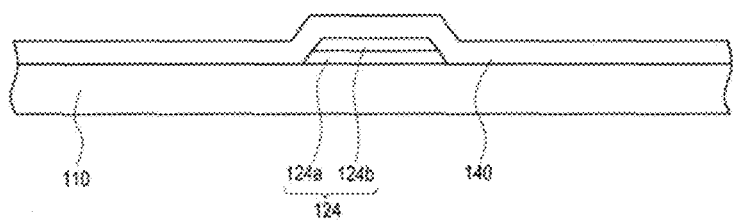

Referring to FIG. 4, a gate insulating layer 140 including silicon nitride (SiNx) as described with reference to FIG. 1 is formed on the gate electrode 124.

Figure 5A:
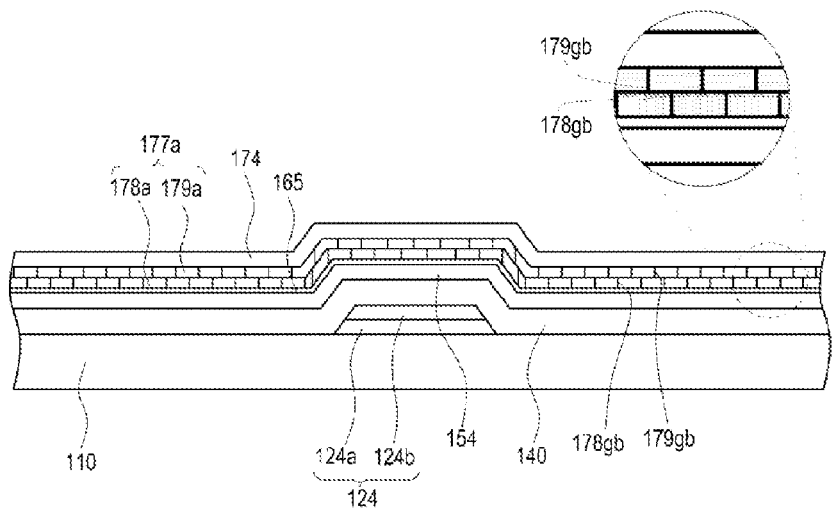
Figure 5B:
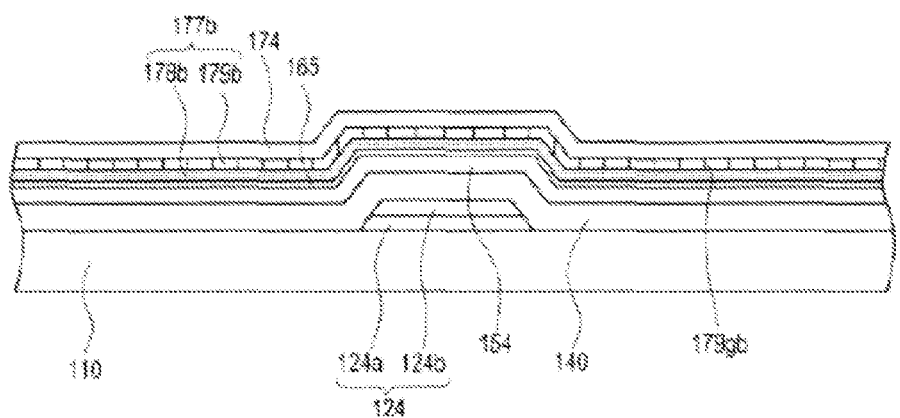
Figure 5C:
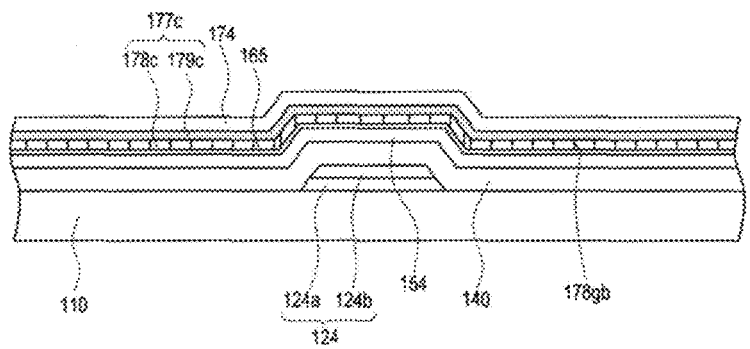
Figure 6:
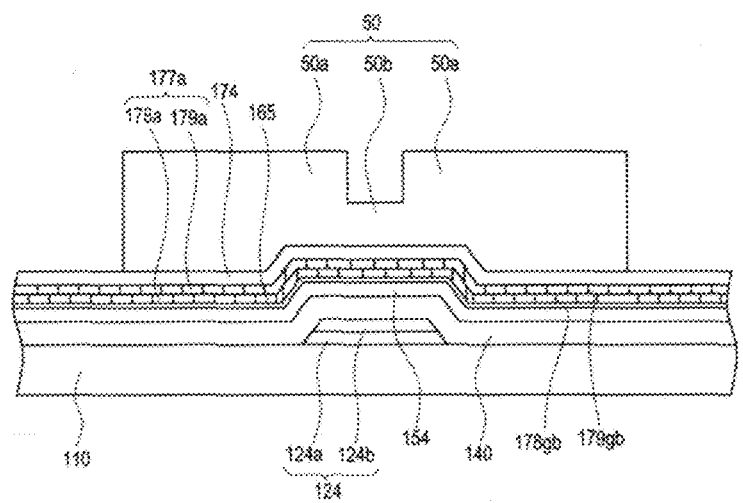
Figure 7:
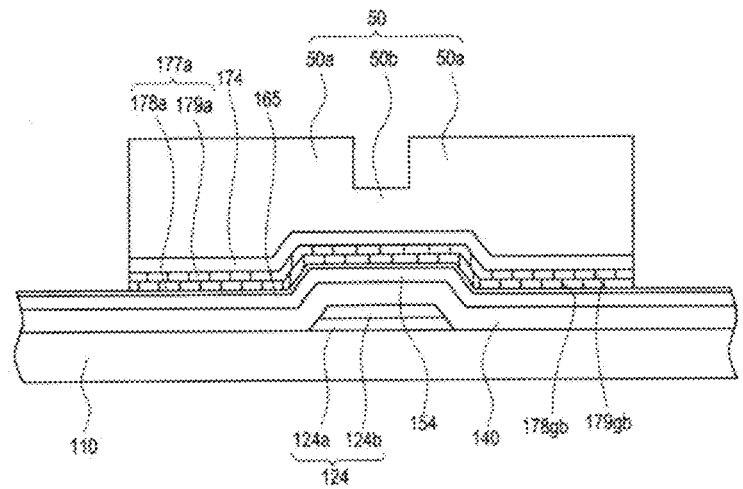
Figure 8:
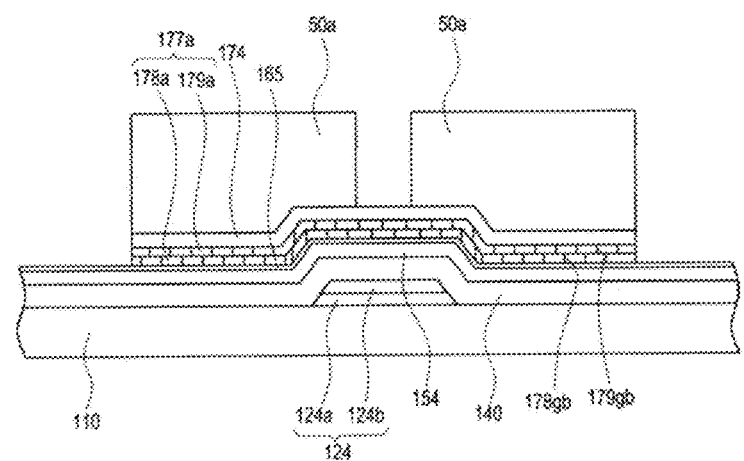
Figure 9:
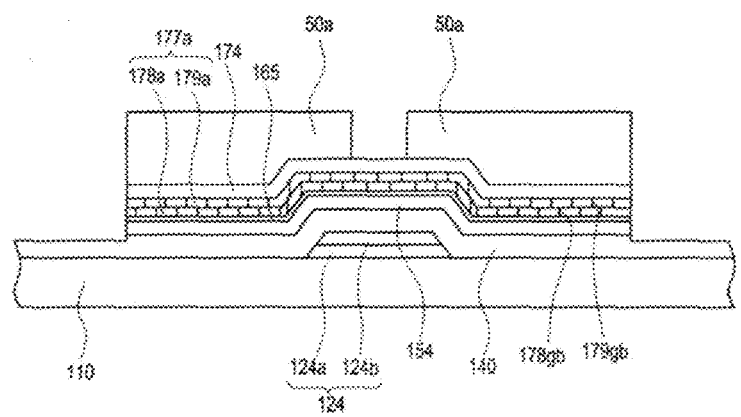
Figure 10:
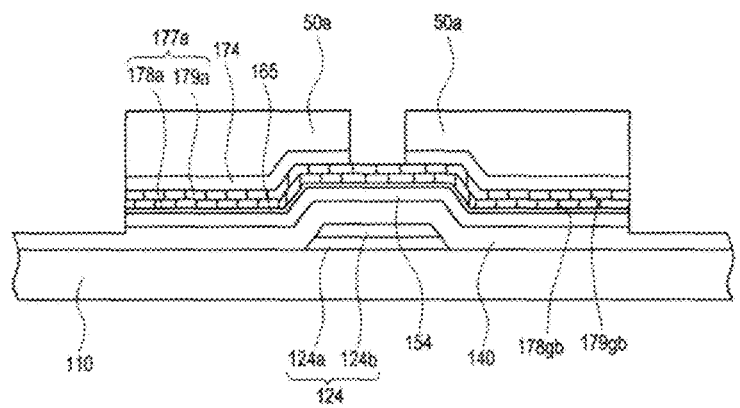
Figure 11:
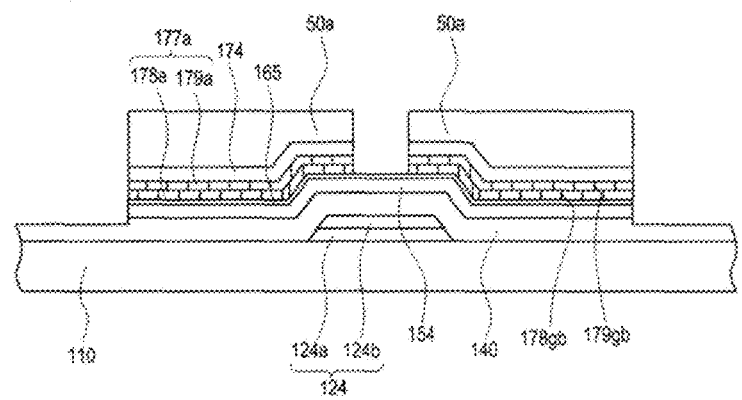
Figure 12:
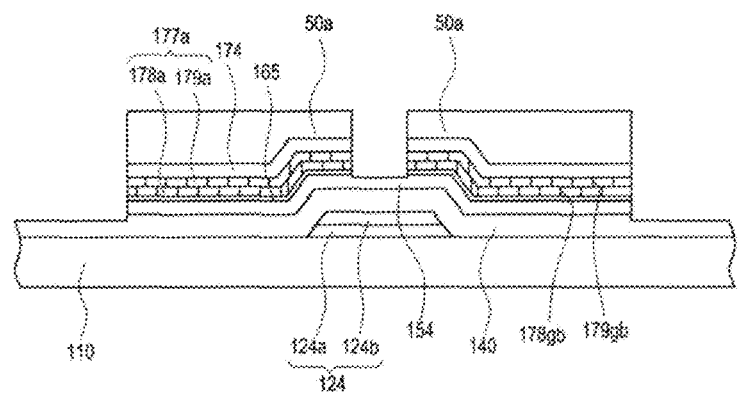
Figure 13:
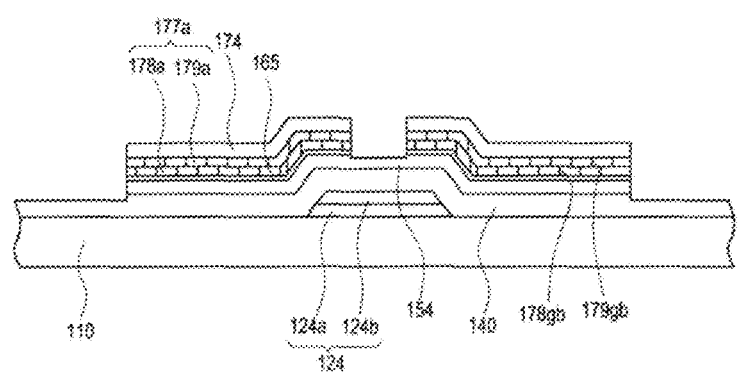

Exemplary embodiments of methods of forming the semiconductor layer 154, the linear ohmic contact material 165, the source electrode 173, and the drain electrode 175 will be described in detail below with reference to FIGS. 5 to 13. FIGS. 5A to 5C illustrate the stack of the semiconductor layer 154, the linear ohmic contact material 165, the first metal diffusion preventing sub-layer 178, the second metal diffusion preventing sub-layer 179, and the main electrode layer 174 according to the invention. FIG. 6 illustrates a pattern of a photo resist 50 formed on the main electrode layer 174. FIG. 7 illustrates a structure of a TFT, after the main electrode layer 174 or metal diffusion preventing layers 177a, 177b and 177c uncovered by the photo resist 50 shown in FIG. 6 is etched. FIG. 8 illustrates a structure of the TFT after a photo resist 50b overlapping a channel is removed by an etch back process. FIG. 9 illustrates a cross-section of the TFT after an active etching process. FIG. 10 illustrates a cross-section of the TFT after a second source-drain etching process. FIG. 11 illustrates a cross-section of the TFT after a third source-drain etching process. FIG. 12 illustrates a cross-section of the TFT after a linear ohmic contact material etching process. FIG. 13 illustrates a cross-section of the TFT after a photo resist 50a on the source electrode 173 and the drain electrode 175 is removed.

Exemplary embodiments of methods of stacking the first metal diffusion preventing sub-layer 178 and the second metal diffusion preventing sub-layer 179 according to the invention will be described in detail below with reference to FIGS. 5A to 5C.

In accordance with the invention, a metal diffusion preventing layer 177a formed by a vacuum break process and a plasma process will be described in detail with reference to FIG. 5A. First, an exemplary embodiment of a method of manufacturing the metal diffusion preventing layer 177a by the vacuum break process according to the invention will be described in detail. The semiconductor layer 154 is formed on the gate insulating layer 140. The linear ohmic contact material 165 may be formed on the semiconductor layer 154. The metal diffusion preventing layer 177a and the main electrode layer 174 are formed on the linear ohmic contact material 165 or the semiconductor layer 154.

The semiconductor layer 154 and the linear ohmic contact material 165 may be formed by chemical vapor deposition ("CVD") or sputtering. The semiconductor layer 154 may include hydrogenated amorphous silicon, crystalline silicon, or oxide semiconductor, which have described with reference to FIG. 1, and the linear ohmic contact material 165 may include an amorphous silicon layer including n-type or p-type impurities, or an oxide forming an ohmic contact. In one exemplary embodiment, for example, when the semiconductor layer 154 includes GaInZnO, the linear ohmic contact material 165 may include a GaZnO oxide. When the semiconductor layer 154 includes an oxide semiconductor material, the linear ohmic contact material 165 is optional.

Thereafter, the metal diffusion preventing layer 177a is formed on the linear ohmic contact material 165 or the semiconductor layer 154. The metal diffusion preventing layer 177a includes a first metal diffusion preventing sub-layer 178a and a second metal diffusion preventing sub-layer 179a, which are stacked in sequence. The main electrode layer 174 is formed on the metal diffusion preventing layer 177a. The metal diffusion preventing layer 177a and the main electrode layer 174 are patterned to form the source electrode 173 and the drain electrode 175. As described above with reference to FIGS. 1, 2A and 2B, the first metal diffusion preventing sub-layer 178a and the second metal diffusion preventing sub-layer 179a prevent metal atoms of the main electrode layer 174 from diffusing or moving into the semiconductor layer 154.

While exemplary embodiments of methods of manufacturing the metal diffusion preventing layer 177a containing titanium (Ti) and the main electrode layer 174 containing copper (Cu) according to the invention will be described hereinbelow, it is apparent to those skilled in the art may that other metallic materials may be applied to the metal diffusion preventing layer 177a and the main electrode layer 174.

The first metal diffusion preventing sub-layer 178a containing titanium (Ti) is formed by sputtering. The first metal diffusion preventing sub-layer 178a may be formed in a sputtering chamber with an argon (Ar) atmosphere by using a titanium (Ti) target. The temperature of the chamber may range from about the room temperature to about 300° C. The first metal diffusion preventing sub-layer 178a includes the first grain boundaries 178gb in a columnar structure, which are formed as its titanium (Ti) grains grow up from the interface with the linear ohmic contact material 165 or the semiconductor layer 154 to the surface thereof. The titanium (Ti) grains in a columnar structure grow up in a direction substantially perpendicular to a lower layer of the TFT, such as the substrate 110. In another exemplary embodiment of the invention, except for a certain thickness of the first metal diffusion preventing sub-layer 178a mixed with the lower layer, for example, except for about 50 Å or less, grain boundaries of grains in the titanium (Ti) layer may not substantially meet each other in a direction where the grains grow up. The first metal diffusion preventing sub-layer 178a may be about 30 Å to about 1000 Å thick, more preferably about 50 Å to about 500 Å thick.

Thereafter, the first metal diffusion preventing sub-layer 178a is exposed to the atmospheric pressure by the vacuum break process. The vacuum break process means a process in which a vacuum-deposited film is put under the atmospheric pressure after undergoing deposition in the vacuum sputtering chamber. The vacuum break process time may be about 10 seconds or more, more preferably about 30 seconds to 24 hours.

After the vacuum break process is completed, the second metal diffusion preventing sub-layer 179a is stacked directly on the first metal diffusion preventing sub-layer 178a in the sputtering chamber. The double layer including the first metal diffusion preventing sub-layer 178a and the second metal diffusion preventing sub-layer 179a together constitute the metal diffusion preventing layer 177a. A method of forming the second metal diffusion preventing sub-layer 179a is the same as the method of forming the first metal diffusion preventing layer sub-178a, so a description thereof is omitted. After the vacuum break process is performed in this way, the second grain boundaries 179gb of the second metal diffusion preventing sub-layer 179a are formed to be substantially discontinuous with respect to the first grain boundaries 178gb in a direction parallel to the direction where the grains grow up. That is, as an interface, for example, grain boundaries are formed between the first metal diffusion preventing sub-layer 178a and the second metal diffusion preventing sub-layer 179a, the second grain boundaries 179gb and the first grain boundaries 178gb are formed discontinuously (e.g., alternate in a direction parallel to the substrate 110). The metal diffusion preventing layer 177a including the discontinuous or alternating grain boundaries 178gb and 179gb reduces or effectively prevents metal atoms of the main electrode layer 174 from diffusing or moving into the semiconductor layer 154.

The main electrode layer 174 is stacked directly on the second metal diffusion preventing sub-layer 179a. In one exemplary embodiment of the invention, the main electrode layer 174 contains copper (Cu). The main electrode layer 174 containing copper (Cu) may be formed in a vacuum chamber having a copper (Cu) target and an argon (Ar) atmosphere by the sputtering technique. The main electrode layer 174 may be about 1,000 Å to about 10,000 Å thick, more preferably about 4,000 Å to about 6,000 Å thick.

Another exemplary embodiment of a method of forming the metal diffusion preventing layer 177a by a plasma process according to the invention will be described in detail hereinbelow. The method of forming the metal diffusion preventing layer 177a by the plasma process is substantially similar to the method of forming the metal diffusion preventing layer 177a by the vacuum break process, described with reference to FIG. 5A, except that the interface between the first metal diffusion preventing sub-layer 178a and the second metal diffusion preventing sub-layer 179a undergoes plasma treatment by a gas. A detailed description thereof will be omitted to avoid redundant description. Like in the method described with reference to FIG. 5A, the first metal diffusion preventing sub-layer 178a containing titanium (Ti) is stacked on the linear ohmic contact material 165 or the semiconductor layer 154 by sputtering. Thereafter, in an exemplary embodiment of the invention, the surface of the first metal diffusion preventing sub-layer 178a undergoes plasma treatment by an inert gas such as nitrogen (N$_2$), oxygen (O$_2$) or argon (Ar) gas by CVD. The plasma-treated surface of the first metal diffusion preventing sub-layer 178a has amorphous characteristics. The plasma treatment time may be about 5 seconds to about 60 seconds.

The second metal diffusion preventing sub-layer 179a is formed on the plasma-treated first metal diffusion preventing sub-layer 178a. A method of forming the second metal diffusion preventing sub-layer 179a is the same as the method described with reference to FIG. 5A, so a detailed description thereof is omitted. As to the formed metal diffusion preventing layer 177a, since the interface between the first metal diffusion preventing sub-layer 178a and the second metal diffusion preventing sub-layer 179a is discontinuous, first grain boundaries 178gb of the first metal diffusion preventing sub-layer 178a having grains in a columnar structure, and second grain boundaries 179gb of the second metal diffusion preventing sub-layer 179a having grains in a columnar structure define a double-layer structure which is substantially discontinuous in a direction perpendicular to a lower layer. The main electrode layer 174 is stacked directly on the second metal diffusion preventing sub-layer 179a.

A method of forming the main electrode layer 174 is the same as the method described with reference to FIG. 5A, so a description thereof is omitted. The formed metal diffusion preventing layer 177a reduces or effectively prevents metal atoms of the main electrode layer 174 from diffusing or moving into the semiconductor layer 154.

An exemplary embodiment of a method of manufacturing metal diffusion preventing layers 177b and 177c, any one of whose metal diffusion preventing sub-layers 178b and 178c, and 179b and 179c have an amorphous structure, will be described in detail hereinbelow with reference to FIGS. 5B and 5C.

First, the metal diffusion preventing sub-layer 178b contacting the linear ohmic contact material 165 or the semiconductor layer 154 and having an amorphous structure will be described in detail with reference to FIG. 5B. The first metal diffusion preventing sub-layer 178b having an amorphous structure is stacked on the linear ohmic contact material 165 or the semiconductor layer 154. The first metal diffusion preventing sub-layer 178b may include titanium nitride (TiNx) or titanium oxide (TiOx). The titanium nitride (TiNx) may be formed in a chamber with an argon (Ar) and nitrogen (N2) atmosphere by using sputtering having a titanium (Ti) target. The titanium oxide (TiOx) may be formed in a chamber with an argon (Ar) and oxygen ($O_2$) atmosphere. The temperature of the chamber may range from about the room temperature to about 300° C. The formed titanium nitride (TiNx) or titanium oxide (TiOx) has an amorphous structure. The first metal diffusion preventing sub-layer 178b may be about 30 Å to about 1000 Å thick, more preferably about 50 Å to about 500 Å thick.

Thereafter, the second metal diffusion preventing sub-layer 179b is formed on the first metal diffusion preventing sub-layer 178b. In one exemplary embodiment of the invention, the second metal diffusion preventing sub-layer 179b includes a plurality of titanium (Ti) grains. A method of forming the second metal diffusion preventing sub-layer 179b is the same as the method of forming the second metal diffusion preventing sub-layer 179a, which has been described with reference to FIG. 5A, so its deposition method will be omitted. The second grain boundaries 179gb of the second metal diffusion preventing sub-layer 179b have a columnar structure where the second metal diffusion preventing sub-layer 179b grows up from the interface with the linear ohmic contact material 165 or the semiconductor layer 154 to the upper surface of the second metal diffusion preventing sub-layer 179b. The formed double layer including the first metal diffusion preventing sub-layer 178b and the second metal diffusion preventing sub-layer 179b together constitute the metal diffusion preventing layer 177b. The amorphous first metal diffusion preventing sub-layer 178b blocks metal atoms of the main electrode layer 174, which diffuse or move along the second grain boundaries 179gb of the second metal diffusion preventing sub-layer 179b, thereby blocking the metal atoms of the main electrode layer 174 from contaminating the semiconductor layer 154 and thus improving the reliability of the TFT.

In one exemplary embodiment of the invention, the second metal diffusion preventing sub-layer 179b may be formed after the upper surface of the first metal diffusion preventing sub-layer 178b undergoes plasma treatment by an inert gas such as nitrogen ($N_2$), oxygen ($O_2$) or argon (Ar) gas. Because it underwent plasma treatment, the upper surface of the first metal diffusion preventing sub-layer 178b is rough, so the amorphous structure of the first metal diffusion preventing sub-layer 178b and the crystalline structure of the second metal diffusion preventing sub-layer 179b are more discontinuous. The main electrode layer 174 is stacked on the second metal diffusion preventing sub-layer 179b. A method of forming the main electrode layer 174 is the same as the method described with reference to FIG. 5A, so a description thereof is omitted.

Next, an exemplary embodiment of a method of forming an amorphous metal diffusion preventing sub-layer 179c between two metal layers 178c and 174 will be described in detail with reference to FIG. 5C. In one exemplary embodiment of the invention, the one metal layer 178c of the two metal layers 178c and 174 includes titanium (Ti), and the other metal layer 174 includes copper (Cu). The amorphous metal diffusion preventing sub-layer 179c includes titanium nitride (TiNx) or titanium oxide (TiOx).

The first metal diffusion preventing sub-layer 178c is stacked on the linear ohmic contact material 165 or the semiconductor layer 154. The first metal diffusion preventing sub-layer 178c contains titanium (Ti), and may be formed like the first metal diffusion preventing sub-layer 178a described with reference to FIG. 5A. Thereafter, the second metal diffusion preventing sub-layer 179c is formed on the first metal diffusion preventing sub-layer 178c. The second metal diffusion preventing sub-layer 179c contains titanium nitride (TiNx) or titanium oxide (TiOx), and may be formed in the same method as the method of manufacturing the first metal diffusion preventing sub-layer 178b, which has been described with reference to FIG. 5B. The formed amorphous second metal diffusion preventing sub-layer 179c reduces or effectively prevents metal atoms of the main electrode layer 174 from diffusing or moving into the semiconductor layer 154, thereby improving the reliability of the TFT.

In one exemplary embodiment of the invention, the upper surface of the first metal diffusion preventing sub-layer 178c may undergo plasma treatment as described with reference to FIG. 5B. The main electrode layer 174 is stacked on the second metal diffusion preventing sub-layer 179c. The forming method and characteristics of the main electrode layer 174 are the same as those described with reference to FIG. 5A. Exemplary embodiments of the methods of stacking the semiconductor layer 154, the linear ohmic contact material 165, the first metal diffusion preventing sub-layer 178, the second metal diffusion preventing sub-layer 179, and the main electrode layer 174 in sequence according to the invention have been described so far.

FIGS. 6 to 13 illustrate an exemplary embodiment of a method of forming patterns of the source electrode 173 and the drain electrode 175. An exemplary embodiment of the method of forming patterns of the source electrode 173 and the drain electrode 175 will be described hereinbelow with reference to the structures of the metal diffusion preventing layer and the main electrode layer described in FIG. 5A in order to avoid redundant description. It is to be noted that even for the structures of the metal diffusion preventing layer and the main electrode layer described in FIGS. 5B and 5C, patterns of the source electrode 173 and the drain electrode 175 are formed as described below.

First, a method of forming a pattern of the photo resist 50 formed on the main electrode layer 174 will be described in detail with reference to FIG. 6. The patterned photo resist 50 has a thick first portion 50a and a relatively thin second portion 50b. That is, a thickness of the first portion 50a is larger than a thickness of the second portion 50b. The photo resist 50 is developed and patterned by the amount or interference of the light transmitting a mask (not shown), to have patterns of the first portion 50a and the second portion 50b. The amount of the transmitting light may be determined by a mask including slit patterns, grid patterns, or a semitransparent layer. In the alternative, the photo resist 50 may be patterned using interference of the light transmitting slit patterns some of which are 180°-phase delayed patterns. The second portion 50b corresponds to a channel region of the TFT.

FIG. 7 illustrates a structure after the main electrode layer 174 and/or the metal diffusion preventing layers 177a, 177b and 177c, uncovered by the photo resist 50, are etched out. A first etching method of etching the main electrode layer 174 and the metal diffusion preventing layer 177a, uncovered by the photo resist 50, will be described regarding each of the embodiments illustrated in FIGS. 5A to 5C.

First, in the structure shown in FIG. 5A, the main electrode layer 174 including copper (Cu) and the metal diffusion preventing layer 177a including titanium (Ti) may be etched by the etchant for simultaneously etching copper (Cu) and titanium (Ti) metals, which has been described with reference to FIG. 3. In the structure shown in FIG. 5B, the main electrode layer 174 including copper (Cu) and the second metal diffusion preventing sub-layer 179b including titanium (Ti) may be etched by the etchant for simultaneously etching copper (Cu) and titanium (Ti) metals, which has been described with reference to FIG. 3. Thereafter, the first metal diffusion preventing sub-layer 178b including titanium nitride (TiNx) or titanium oxide (TiOx) may be patterned by a dry etching method that uses a mixed gas including a sulfur hexafluoride gas ($SF_6$) and a chlorine gas ($Cl_2$), or a mixed gas including a chlorine gas ($Cl_2$) and a boron trichloride gas ($BCl_3$). For example, a mixing ratio of an $SF_6$ gas to a $Cl_2$ gas may be about 1:14, and a mixing ratio of a $Cl_2$ gas to a $BCl_3$ gas may be 1:2. In the structure shown in FIG. 5C, the main electrode layer 174 including copper (Cu) may be etched by the etchant for etching a copper (Cu) metal, which has been described with reference to FIG. 3. Thereafter, the second metal diffusion preventing sub-layer 179c including titanium nitride (TiNx) or titanium oxide (TiOx) and the first metal diffusion preventing sub-layer 178c including titanium (Ti) may be etched by the above-described method for dry-etching the second metal diffusion preventing sub-layer 179b in the structure of FIG. 5B. The main electrode layer 174 and the metal diffusion preventing layer 177, which are etched by using the photo resist 50 as a mask in this manner, have a structure illustrated in FIG. 7.

FIG. 8 illustrates a cross-section after a photo resist 50b overlapping a channel portion is removed by an etch back process. That is, the main electrode layer 174 overlapping the channel portion is exposed by the etch back process. The etch back process is a process of uniformly removing the photo resists 50 (50a and 50b) by a predetermined thickness by known ashing. The predetermined thickness may be a thickness of the photo resist 50b overlapping the channel portion.

FIG. 9 illustrates a cross-section of the TFT after an active etching process. The semiconductor layer 154 and the linear ohmic contact material 165 formed on outer sides of the source electrode 173 and the drain electrode 175 are removed by the active etching process. The active etching process may be performed by a dry etching method using a mixed gas including a mixture of an $SF_6$ gas with a $Cl_2$ gas in a ratio of about 1:4. The surface of the gate insulating layer 140 may be slightly removed by the active etching process.

FIG. 10 illustrates a cross-section of the TFT after a second source-drain etching process. The main electrode layer 174 overlapping the channel portion and uncovered by the photo resist 50 is etched by the second source-drain etching process. In one exemplary embodiment of the invention, the main electrode layer 174 including copper (Cu) metal may be etched by the wet etching method using a copper (Cu) etchant, which has been described with reference to FIG. 3.

FIG. 11 illustrates a cross-section of the TFT after a third source-drain etching process. The metal diffusion preventing layers 177 (177a, 177b, and 177c) overlapping the channel portion are etched by the third source-drain etching process. The third source-drain etching process may be performed by a dry etching method. In one exemplary embodiment of the invention, the first and second metal diffusion preventing sub-layers 178a, 179a, 178b, 179b, 178c, and 179c including titanium (Ti), titanium nitride (TiNx) or titanium oxide (TiOx) may be patterned by being simultaneously etched by the dry etching method that uses a mixed gas including a mixture of an $SF_6$ gas with a $Cl_2$ gas in a ratio of about 1:14.

By performing the third source-drain etching process using dry etching, channels of TFTs may be formed to have a uniform length.

FIG. 12 illustrates a cross-section of the TFT after a linear ohmic contact material etching process. The linear ohmic contact material 165 formed on the channel portion of the TFT is removed by the linear ohmic contact material etching process, thereby forming the channel portion of the TFT. That is, the first metal diffusion preventing sub-layer 178 is separated into a first source metal diffusion preventing sub-layer 178s and a first drain metal diffusion preventing sub-layer 178d by the channel portion; the second metal diffusion preventing sub-layer 179 is separated into a second source metal diffusion preventing sub-layer 179s and a second drain metal diffusion preventing sub-layer 179d; and the main electrode layer 174 is separated into a first source electrode layer 174s and a first drain electrode layer 174d. The linear ohmic contact material etching process may be performed by the dry etching method that uses a mixed gas including a mixture of an $SF_6$ gas with a $Cl_2$ gas in a ratio of about 1:1. The surface of the semiconductor layer 154 corresponding to the channel portion of the TFT may be partially etched by the linear ohmic contact material etching process. As the surface of the semiconductor layer 154 is partially etched, on/off characteristics of the TFT may be improved.

FIG. 13 illustrates a cross-section of the TFT after the photo resist 50a on the first source electrode layer 174s and the first drain electrode layer 174d is removed. The photo resist 50a is removed after the source electrode 173 and the drain electrode 175 are formed.

Thereafter, as illustrated in FIG. 1, a protection layer 180 is formed on the source electrode 173 and the drain electrode 175. The protection layer 180 may include the same materials as the above-described materials of the gate insulating layer 140. The protection layer 180 protects and insulates the source electrode 173, the drain electrode 175, and the channel of the semiconductor layer 154.

In this manner, the metal diffusion preventing layers 177a, 177b, and 177c included in the source electrode 173 and the drain electrode 175 reduce or effectively prevent metal atoms of the first source electrode layer 174s and the first drain electrode layer 174d from moving into the semiconductor layer 154. The TFT manufactured by the exemplary embodiments of the invention has excellent on/off characteristics even after driven for a long time.

Figure 14:
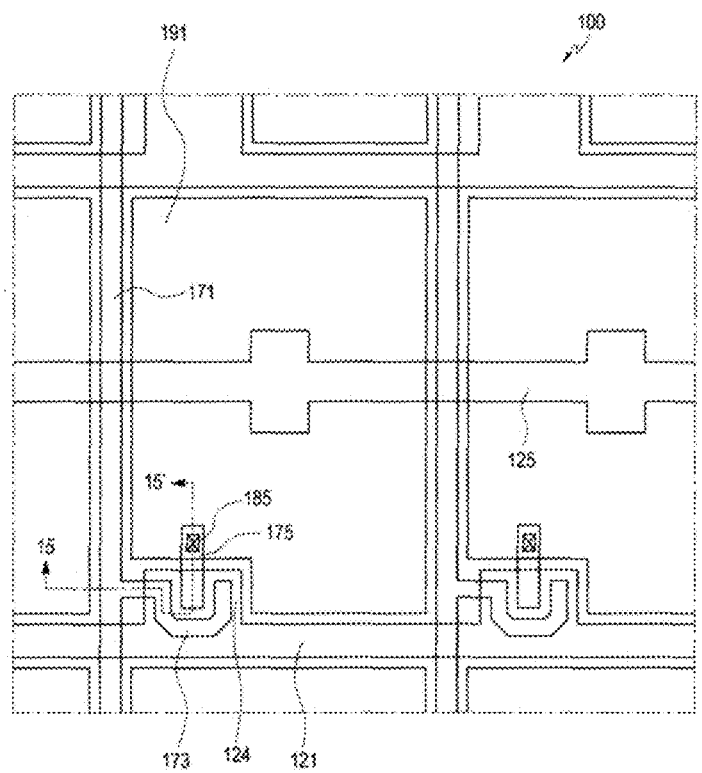
FIG. 14 is a plan view of an exemplary embodiment of a TFT panel according to the invention.
Figure 15:
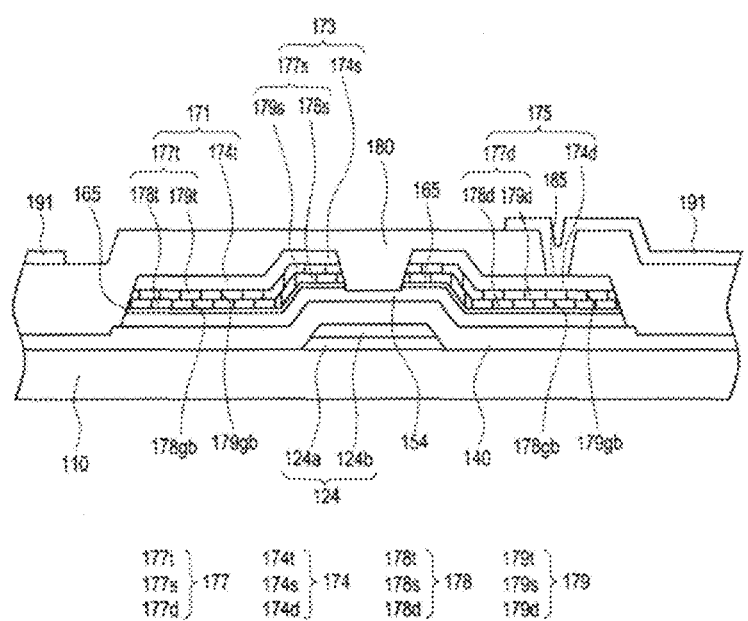
FIG. 15 is a cross-sectional view taken along line 15-15' of the TFT panel shown in FIG. 14.

An exemplary embodiment of a TFT panel 100 according to the invention will be described hereinbelow with reference to FIGS. 14 to 15. The TFT and its manufacturing methods described above with reference to FIGS. 1 to 13 may be used in manufacturing a TFT panel. Therefore, redundant descriptions will be omitted in describing the TFT panel. FIG. 14 is a plan view of an exemplary embodiment of a TFT panel 100 according to the invention. FIG. 15 is a cross-sectional view taken along line 15-15' on the TFT panel 100 shown in FIG. 14.

A gate layer conductor including a plurality of gate lines 121, a plurality of gate electrodes 124, and a plurality of storage electrode lines 125 is on the substrate 110 including a glass or plastic material. The substrate 110 is about 0.2 millimeter (mm) to about 0.7 mm thick. The plurality of gate lines 121 mainly extend in the horizontal direction and transfer gate signals. Each of the plurality of gate lines 121 includes a plurality of gate electrodes 124 protruding from the gate line 121. The storage electrode line 125 transfers a common voltage Vcom, for example, a direct current ("DC"), or predetermined swing voltages having two or more levels. In one exemplary embodiment of the invention, the gate layer conductor has a double-layer structure including a first gate sub-electrode 124a and a second gate sub-electrode 124b. The first gate sub-electrode 124a may be about 10 Å to about 500 Å thick and may include titanium (Ti), while the second gate sub-electrode 124b may be about 1000 Å to about 7000 Å thick, and may include copper (Cu).

The gate insulating layer 140 is on the gate layer conductor. The gate insulating layer 140 includes a structure and is formed as described above with reference to FIG. 1.

The semiconductor layer 154 is on the gate insulating layer 140 as described above with reference to FIG. 1.

The linear ohmic contact material 165 is on the semiconductor layer 154 as described above with reference to FIG. 1. In another exemplary embodiment of the invention, the linear ohmic contact material 165 is omitted.

A data layer conductor including a data line 171, the source electrode 173, and the drain electrode 175 is on the linear ohmic contact material 165 or the semiconductor layer 154. In one exemplary embodiment of the invention, the data layer conductor has a triple-layer structure as illustrated in FIG. 15. That is, the data layer conductor includes a double-layered metal diffusion preventing layer 177 and a single-layered main electrode layer 174. The data line 171 has a first data wiring layer 174t and a data metal diffusion preventing layer 177t. The source electrode 173 has a first source electrode layer 174s and a source metal diffusion preventing layer 177s, and the drain electrode 175 has a first drain electrode layer 174d and a drain metal diffusion preventing layer 177d. The data line 171 is connected to a data driver (not shown) and transfers a data voltage corresponding to an image signal to the source electrode 173.

The main electrode layer 174 includes the first data wiring layer 174t, the first source electrode layer 174s, and the first drain electrode layer 174d. The first data wiring layer 174t, the first source electrode layer 174s, and the first drain electrode layer 174d may include the same material, and/or may be simultaneously deposited.

The metal diffusion preventing layer 177 includes the data metal diffusion preventing layer 177t, the source metal diffusion preventing layer 177s, and the drain metal diffusion preventing layer 177d. As described above, the metal diffusion preventing layer 177 reduces or effectively prevents metal atoms of the main electrode layer 174 from diffusing into the semiconductor layer 154.

The data metal diffusion preventing layer 177t includes a first data metal diffusion preventing sub-layer 178t, and a second data metal diffusion preventing sub-layer 179t on the first data metal diffusion preventing sub-layer 178t. The source metal diffusion preventing layer 177s includes a first source metal diffusion preventing sub-layer 178s, and a second source metal diffusion preventing sub-layer 179s on the first source metal diffusion preventing sub-layer 178s.

First grain boundaries of the first source metal diffusion preventing sub-layer 178s and second grain boundaries of the second source metal diffusion preventing sub-layer 179s are discontinuous. The drain metal diffusion preventing layer 177d includes a first drain metal diffusion preventing sub-layer 178d, and a second drain metal diffusion preventing sub-layer 179d on the first drain metal diffusion preventing sub-layer 178d. First grain boundaries of the first drain metal diffusion preventing sub-layer 178d and second grain boundaries of the second drain metal diffusion preventing sub-layer 179d are discontinuous.

The first data metal diffusion preventing sub-layer 178t, the first source metal diffusion preventing sub-layer 178s, and the first drain metal diffusion preventing sub-layer 178d included in a first metal diffusion preventing sub-layer 178 may include the same material, and/or may be simultaneously deposited by the same material. The second data metal diffusion preventing sub-layer 179t, the second source metal diffusion preventing sub-layer 179s, and the second drain metal diffusion preventing sub-layer 179d of the second metal diffusion preventing sub-layer 179 may include the same material, and/or may be simultaneously deposited. Each of the first and second metal diffusion preventing sub-layers 178 and 179 may be about 30 Å to about 1000 Å thick, more preferably about 50 Å to about 500 Å thick.

In one exemplary embodiment of the invention, as described above with reference to FIGS. 1 and 5A, the main electrode layer 174 may include copper (Cu), while the first and second metal diffusion preventing sub-layers 178 and 179 may include titanium (Ti). The first and second metal diffusion preventing sub-layers 178 and 179 may have independent polycrystalline structures including grain boundaries in a columnar structure. The first grain boundaries of the first metal diffusion preventing sub-layer 178 and including titanium (Ti), and the second grain boundaries of the second metal diffusion preventing sub-layer 179 and including titanium (Ti) are discontinuously arranged, thereby reducing or effectively preventing copper (Cu) atoms of the main electrode layer 174 from diffusing into the semiconductor layer 154.

In another exemplary embodiment of the invention, as described above with reference to FIG. 1, and 5B or 5C, the main electrode layer 174 may include copper (Cu), and any one of the first and second metal diffusion preventing sub-layers 178 and 179 may include titanium nitride (TiNx) or titanium oxide (TiOx) in an amorphous structure, while the other metal diffusion preventing layer may include titanium (Ti) in a polycrystalline structure. The first and second metal diffusion preventing sub-layers 178 and 179 reduce or effectively prevent the diffusion of copper (Cu) atoms if the main electrode layer 174, ensuring excellent switching capabilities of the TFT panel 100.

A protection layer 180 is on the data layer conductor. The protection layer 180 may include the materials described above with reference to FIGS. 1 and 3. The protection layer 180 has a plurality of contact holes 185 exposing one ends of drain electrodes 175.

A plurality of pixel electrodes 191 is on the protection layer 180. A pixel electrode 191 is electrically connected to the drain electrode 175 via a contact hole 185, and receives a data voltage from the drain electrode 175. The pixel electrode 191, to which a data voltage is applied, generates an electric field together with a common electrode (not shown) receiving a common voltage, thereby determining directions of liquid crystal molecules in a liquid crystal layer (not shown) between the two electrodes. The liquid crystal layer between the pixel electrode 191 and the common electrode forms a liquid crystal capacitor, and maintains the data voltage even after the TFT is turned off. The pixel electrode 191 may form a storage capacitor by overlapping the storage electrode line 125, thereby enhancing the liquid crystal capacitor's ability to maintain a voltage. The pixel electrode 191 may include a transparent conductor such as indium tin oxide ("ITO") and indium zinc oxide ("IZO"). The manufactured TFT panel may have low-resistance wirings, and maintain the outstanding characteristics of TFTs for a long time.

Figure 16:
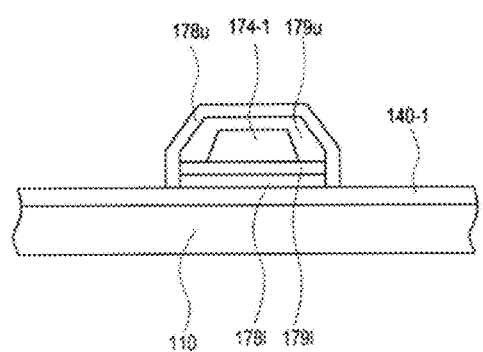
FIG. 16 is a cross-sectional view of an exemplary embodiment of a wiring or an electrode according to the invention.

An exemplary embodiment of a structure of a wiring or an electrode according to the invention will be described herein below with reference to FIG. 16. FIG. 16 illustrates a cross-section of a wiring or an electrode according to the invention. The structure of a wiring or an electrode illustrated in FIG. 16 is an example in which the wiring or the electrode are directly on a substrate 110. In the alternative, the wiring/electrode structure according to the invention may be on a circuit element previously on the substrate 110, or on a part of the circuit element. The wiring or the electrode illustrated in FIG. 16 may be manufactured by the TFT manufacturing methods described above with reference to FIGS. 1 to 13, so a detailed description of a manufacturing method will be omitted. As illustrated in FIG. 16, a wiring insulating layer 140-1 is on the substrate 110 including a glass or plastic material. The wiring insulating layer 140-1 may include silicon nitride (SiNx) and may be formed by CVD. The wiring insulating layer 140-1 may be about 200 nanometers (nm) to about 500 nm thick.

A first wiring metal diffusion preventing sub-layer 178*l* is directly on the wiring insulating layer 140-1, and a second wiring metal diffusion preventing sub-layer 179*l* is on the first wiring metal diffusion preventing sub-layer 178*l*. The first and second wiring metal diffusion preventing sub-layers 178*l* and 179*l* may be formed by the method of manufacturing the metal diffusion preventing layer 177, which has been described with reference to FIGS. 5A to 5C, and may be patterned by the photo resist, the mask, and the etching method, which have been described with reference to FIGS. 6 to 13.

A wiring or electrode layer 174-1 is on the first or second wiring metal diffusion preventing sub-layer 178*l* or 179*l*. In one embodiment of the invention, the wiring or electrode layer 174-1 includes copper (Cu). The wiring or electrode layer 174-1 is narrower or smaller than the first or second wiring metal diffusion preventing sub-layer 178*l* or 179*l*. The wiring or electrode layer 174-1 including copper (Cu) may be formed by the method described above with reference to FIGS. 5A to 5C, and may be patterned by the photo resist, the mask, and the etching method, which have been described with reference to FIGS. 6 to 13.

A third wiring metal diffusion preventing sub-layer 179*u* covers upper and side surfaces of the wiring or electrode layer 174-1, and a fourth wiring metal diffusion preventing sub-layer 178*u* covers outer surfaces of the third wiring metal diffusion preventing sub-layer 179*u*. The wiring or electrode layer 174-1 is surrounded by the first wiring metal diffusion preventing sub-layer 178*l*, the second wiring metal diffusion preventing sub-layer 179*l*, the third wiring metal diffusion preventing sub-layer 179*u*, and the fourth wiring metal diffusion preventing sub-layer 178*u*, such that no portion of the wiring or electrode layer 174-1 is exposed. In the wiring/electrode structure of the illustrated embodiment, the first, second, third and fourth wiring metal diffusion preventing sub-layers 178*l*, 179*l*, 179*u*, and 178*u* reduce or effectively prevent diffusion of metal atoms of the wiring or electrode layer 174-1. If this wiring/electrode structure is applied to a circuit, metal atoms, for example, copper (Cu) atoms of a wiring or an electrode may be reduced or effectively prevented from diffusing into adjacent circuit elements, avoiding degradation of characteristics of the circuit elements. This wiring/electrode structure may be applied to gate electrodes, or source and drain electrodes included in TFTs including amorphous silicon or polycrystalline silicon.

In one exemplary embodiment of the invention, the wiring or electrode layer 174-1 includes copper (Cu), and the first, second, third and fourth wiring metal diffusion preventing sub-layers 178*l*, 179*l*, 179*u*, and 178*u* include titanium (Ti). The first wiring metal diffusion preventing sub-layer 178*l* and the fourth wiring metal diffusion preventing sub-layer 178*u* may include the same material, and the second wiring metal diffusion preventing sub-layer 179*l* and the third wiring metal diffusion preventing sub-layer 179*u* may include the same material.

In one exemplary embodiment of the invention, the first, second, third and fourth wiring metal diffusion preventing sub-layers 178*l*, 179*l*, 179*u*, and 178*u* may include polycrystalline structures including grain boundaries in a columnar structure. Polycrystalline first grain boundaries of the first wiring metal diffusion preventing sub-layer 178*l* and polycrystalline second grain boundaries of the second wiring metal diffusion preventing sub-layer 179*l* are discontinuous. Polycrystalline first grain boundaries of the fourth wiring metal diffusion preventing sub-layer 178*u* and polycrystalline second grain boundaries of the third wiring metal diffusion preventing sub-layer 179*u* are discontinuous. Because of the discontinuous first grain boundaries and second grain boundaries, copper (Cu) atoms of the wiring or electrode layer 174-1 may not be diffused to other layers.

In another exemplary embodiment of the invention, any one of the first and second wiring metal diffusion preventing sub-layers 178*l* and 179*l* may include titanium nitride (TiNx) or titanium oxide (TiOx) in an amorphous structure, while the other metal diffusion preventing layer may include titanium (Ti) in a polycrystalline structure. Similarly, any one of the fourth and third wiring metal diffusion preventing sub-layers 178*u* and 179*u* may include titanium nitride (TiNx) or titanium oxide (TiOx) in an amorphous structure, while the other metal diffusion preventing layer may include titanium (Ti) in a polycrystalline structure. The first wiring metal diffusion preventing sub-layer 178*l* and the fourth wiring metal diffusion preventing layer sub-178*u* may include the same material, and the second wiring metal diffusion preventing sub-layer 179*l* and the third wiring metal diffusion preventing sub-layer 179*u* may include the same material. The formed wiring metal diffusion preventing sub-layers 178*l*, 179*l*, 178*u*, and 179*u* prevent copper (Cu) atoms of the wiring or electrode layer 174-1 from diffusing into other layers, ensuring high reliability of circuit elements including this wiring/electrode structure.

As is apparent from the foregoing description, in accordance with the exemplary embodiments of the TFT and manufacturing methods thereof according to the invention, metal atoms of electrode layers may not be diffused into a semiconductor layer of the TFT, ensuring the high reliability characteristics of the TFT.

In addition, the TFT panel of the invention has wirings including low-resistance materials, thereby reducing the possible signal delays caused by wiring resistance.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A thin film transistor comprising:
   a gate electrode;
   a gate insulating layer on the gate electrode;
   a semiconductor on the gate insulating layer;
   a drain electrode and a source electrode on the semiconductor and spaced apart from each other; and
   each of the drain electrode and the source electrode comprises:
      a first metal diffusion preventing layer on the gate insulating layer, wherein the first metal diffusion preventing layer prevents diffusion of metal atoms, and
      a second metal diffusion preventing layer on the first metal diffusion preventing layer;

wherein
at least one of the first and second metal diffusion preventing layers includes grains in a columnar structure which are in a direction substantially perpendicular to the semiconductor,
any of the first and second metal diffusion preventing layers contains polycrystalline titanium, the polycrystalline titanium having a plasma-treated surface layer of a titanium oxide (TiOx) amorphous structure, and
first grain boundaries of the first metal diffusion preventing layer and second grain boundaries of the second metal diffusion preventing layer are substantially discontinuous in a direction perpendicular to the semiconductor, the first and second metal diffusion preventing layers having the plasma-treated surface layer of the titanium oxide (TiOx) amorphous structure therebetween.

2. The thin film transistor of claim 1, wherein each of the drain electrode and the source electrode further comprises a main electrode layer including copper (Cu), the first and second metal diffusion preventing layers between the semiconductor and the main electrode layer.

3. The thin film transistor of claim 1, wherein each of the first and second metal diffusion preventing layers is about 50 Å to about 500 Å thick.

4. The thin film transistor of claim 1, wherein the first metal diffusion preventing layer is in direct contact with the semiconductor.

5. The thin film transistor of claim 4, further comprising a linear ohmic contact material on the semiconductor, wherein the first metal diffusion preventing layer is in direct contact with the linear ohmic contact material.

6. The thin film transistor of claim 1, wherein the first metal diffusion preventing layer is titanium (Ti).

7. The thin film transistor of claim 1, wherein the second metal diffusion preventing layer includes titanium (Ti).

8. A thin film transistor panel comprising:
a gate electrode connected to a gate wiring on an insulating substrate;
a gate insulating layer on the gate electrode;
a semiconductor on the gate insulating layer;
a drain electrode and a source electrode on the semiconductor and spaced apart from each other; and
a pixel electrode connected to the drain electrode and the source electrode;
wherein each of the drain electrode and the source electrode includes a first metal diffusion preventing layer, a second metal diffusion preventing layer, and a source-drain layer on the second metal diffusion preventing layer; and
wherein
at least one of the first and second metal diffusion preventing layers includes grains in a columnar structure, which are in a direction substantially perpendicular to the semiconductor,
any of the first and second metal diffusion preventing layers contains polycrystalline titanium, the polycrystalline titanium having plasma-treated surface layer of a titanium oxide (TiOx) amorphous structure, and
first grain boundaries of the first metal diffusion preventing layer and second grain boundaries of the second metal diffusion preventing layer are substantially discontinuous in a direction perpendicular to the semiconductor, the first and second metal diffusion preventing layers having the plasma-treated surface layer of the titanium oxide (TiOx) amorphous structure therebetween.

9. The thin film transistor panel of claim 8, wherein the first metal diffusion preventing layer is between the semiconductor and the second metal diffusion preventing layer.

10. The thin film transistor panel of claim 9, wherein the first and second metal diffusion preventing layers include titanium (Ti), and the source-drain layer includes copper (Cu).

11. The thin film transistor panel of claim 10, wherein each of the first and second metal diffusion preventing layers includes the grains in a columnar structure.

* * * * *